United States Patent [19]

Treat et al.

[11] Patent Number: 5,412,678
[45] Date of Patent: * May 2, 1995

[54] MULTI-BEAM, ORTHOGONALLY-POLARIZED EMITTING MONOLITHIC QUANTUM WELL LASERS

[75] Inventors: David W. Treat, San Jose; David P. Bour, Spring Court Cupertino; Thomas L. Paoli, Los Altos, all of Calif.

[73] Assignee: Xerox Corporation, Stamford, Conn.

[*] Notice: The portion of the term of this patent subsequent to Mar. 7, 2012 has been disclaimed.

[21] Appl. No.: 948,524

[22] Filed: Sep. 22, 1992

[51] Int. Cl.$^6$ .......................... H01S 3/103; H01S 3/19
[52] U.S. Cl. ......................................... 372/45; 372/50; 372/8; 372/27
[58] Field of Search .................... 372/26, 27, 50, 8, 45; 312/46

[56] References Cited

U.S. PATENT DOCUMENTS

| | | |
|---|---|---|
| 4,069,463 | 1/1978 | McGroddy et al. ................ 331/94.5 |
| 4,531,217 | 7/1985 | Kitamura . |
| 4,870,652 | 9/1989 | Thornton . |
| 4,916,710 | 4/1990 | Hattori . |
| 5,007,063 | 4/1991 | Kahen ..................... 372/45 |
| 5,048,040 | 9/1991 | Paoli ....................... 372/50 |
| 5,117,469 | 5/1992 | Chueng et al. .......... 385/11 |

OTHER PUBLICATIONS

S. R. Chinn, P. S. Zory, and A. R. Resinger, IEEE Jour Quantum Electronics 24, 2191–2214. No. 11 Nov. 1988.

P. J. A. Thijs, L. F. Theimeijer, P. I. Kuindersma, J. J. M. Binsma, and T. van Dongen, IEEE Jour, Quantum Electronics 27, 1426–1439 (1991). Jun. 6.

L. F. Teimeijer, P. J. A. Thijs, P. J. de Waard, J. J. M. Binsma, and T. van Dongen, Appl. Phys. Lett. 58, 2738–2740 (1991). June.

M. J. B. Boermans, S. H. Hagen, A. Valster, Mn. N. Finke, and J. M. M. van der Heyden, Electronics Lett. 26, 1438–1439 (1990). Aug.

D. F. Welch, T. Wang, and D. R. Scifres, Electronics Lett. 27, 693–695 91991). Apr.

M. Kondo, K. Domen, C. Anayama, T. Tanahashi, and K. Nakajima, Jour. Crystal Growth 107, 578–582 (1991). No Month Available.

S. H. Pan, H. Shen, Z. Hang, F. H. Pollak, W. Zhuang, Q. Xu, A. P. Roth, R. A. Masut, C. Lacelle, and D. Morris, Phys. Rev. B-38, 3375–3382 (1988). Aug.

S. W. Corzine and L. A. Caldren, Appl. Phys. Lett., 59, 588–590 (1991). Jul.

H. C. Casey, Jr. and M. B. Panish, Heterostructure Lasers Part A: Fundamental Principles, Academic Press Orlando, Fla. (1978) pp. 79–82. No Month Available.

"GaInAsP Alloy Semiconductors", T. P. Pearsall, ed. John Wirley & Sons, N.Y. (1982) pp. 61–106. No Month Available.

H. C. Casey, Jr. & M. B. Panish, "Heterostructure Lasers Part B: Materials & Operating Characteristics", Academic Press, Orlando, Fla. (1978) pp. 132–148. No Month Available.

*Primary Examiner*—Rodney B. Bovernick
*Assistant Examiner*—Robert McNutt
*Attorney, Agent, or Firm*—Rosen, Dainow & Jacobs

[57] ABSTRACT

A QW diode laser generating orthogonally polarized multiple beams. The device incorporates quantum well active regions capable of, transitions to heavy hole and light hole band edges. The heavy hole transition provides TE-mode gain, while the light hole band provides mostly TM-mode gain. By controlling the compositions and thicknesses of the active regions, both modes can be obtained in a monolithic structure. In addition, the resulting laser polarization will be very sensitive to the threshold carrier density. With an intracavity loss modulator in such a structure, the polarization can also be controlled. Other ways of causing side-by-side lasers to operate, respectively, in their TE or TM modes are also described.

33 Claims, 7 Drawing Sheets

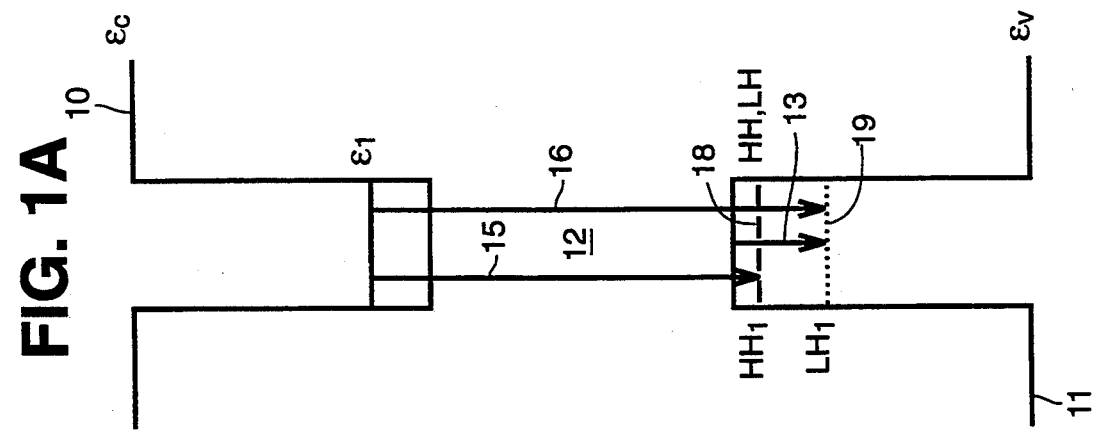
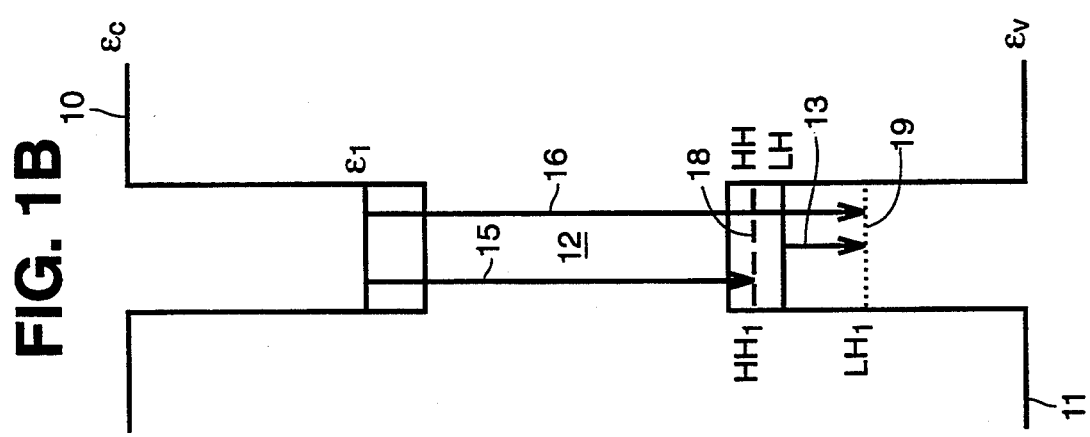
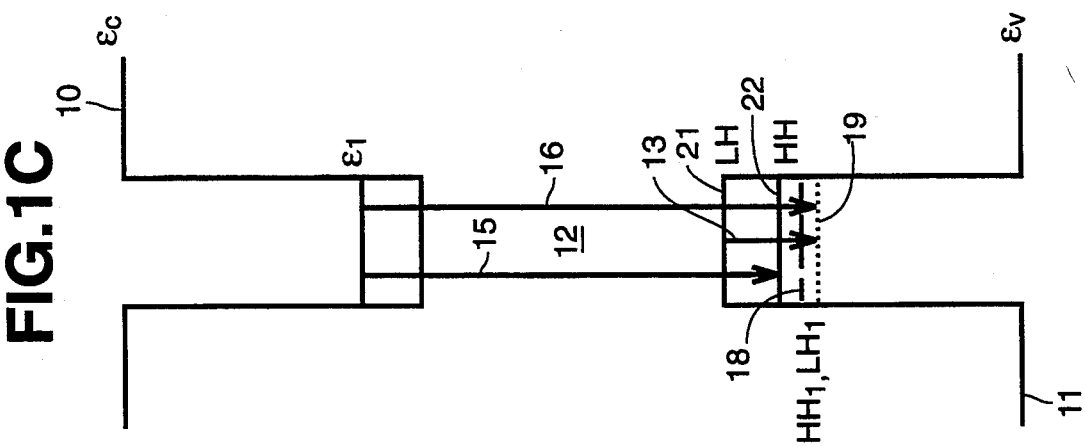

MULTI-BEAM, ORTHOGONALLY-POLARIZED EMITTING MONOLITHIC QUANTUM WELL LASERS

RELATED APPLICATIONS (1) Commonly-assigned, concurrently filed application Ser. No. 07/948,531, filed Sep. 22, 1992, entitled "Diode Laser Multiple Output Scanning System" (D/91293-IP/902080) in the name of Thomas L. Paoli.

(2) Commonly-assigned, concurrently-filed application Ser. No. 07/948,522, filed Sep. 22, 1992, entitled "Polarization Switchable Quantum Well Laser" (IP 911705) (XRX-126).

(3) Commonly-assigned, concurrently-filed application Ser. No. 07/812,238, filed Dec. 19, 1991, entitled "A raster Output Scanner for a Single Pass Printing System which Separates Plural Laser Beams by Wavelength and Polarization", in the names of James J. Appel and Thomas L. Paoli.

This invention relates to a semiconductor quantum well laser, and, in particular, to a monolithic quantum well laser capable of differently polarized multiple emissions, specifically with orthogonally polarized beams.

BACKGROUND OF THE INVENTION

Quantum well (QW) lasers normally oscillate in the transverse electric (TE) polarization rather than the transverse magnetic (TM), because the n=1 heavy hole transition is the fundamental (lowest energy) transition, and the lowest energy state is the state whose population is most easily inverted. This is true for both unstrained GaAs and compressively strained InGaAs/AlGaAs and InGaAs/InGaAsP/InP QW lasers. The heavy hole is lowest in energy because the quantum shifts are inversely proportional to the effective mass; therefore the light hole levels are shifted to higher energies than the heavy hole levels. Additionally, in compressively strained InGaAs/AlGaAs and InGaAs/InGaAsP lasers, the strain leads to an even greater difference between these levels.

Transitions involving the heavy hole band have a 3:0 asymmetry for TE:TM mode gain, while those involving the light hole levels have a 1:4 asymmetry for TE:TM mode gain. Such a gain anisotropy does not occur in double heterostructure (DH) lasers, which have a bulk-like active region. This is why, in a QW laser, the TE-mode gain arises from the heavy hole transition, while the TM-mode gain is provided by the light hole transitions.

The first related application Ser. No. 07/948,531, whose contents are hereby incorporated by reference, discloses the implementation of monolithic, multiple beam laser diode sources for use in multistation xerographic processors with single optics. The devices in this implementation could produce laser beams with two nearly orthogonal polarizations. A quadbeam laser diode device implemented with this concept would permit considerable simplification in a four-beam optical system through the use of beam separation by polarization at two wavelengths. The quadbeam laser device is achieved by appropriate orientation of closely spaced laser chips within a single integrated package or by the relative orientation of the linearly polarized beams emitted by a monolithic laser array. Such monolithic arrays are obtained, for example, by combining the multiple wavelength techniques disclosed in U.S. Pat. No. 5,048,040 issued to Paoli with the multiple polarization techniques disclosed herein.

SUMMARY OF THE INVENTION

An object of the invention is an improved multi-beam QW semiconductor laser.

A further object of the invention is a semiconductor monolithic QW laser having two or more active regions, with each region emitting such that each region emits a beam having one of the two orthogonal polarizations.

An aspect of the present invention is based on the discovery that active portions of a semiconductor QW laser can be caused to selectively emit TE or TM polarized emissions. This is based upon the following observation that in a structure where the light hole and heavy hole band edges are reversed, such as can occur in a tensile-strained active region, the resulting polarization is TM. This has been observed in tensile strained InGaAsP/InP Qws and in both bulk and QW devices in the GaInP/AlGaInP/GaAs material systems. We have further discovered that the polarization mode of a QW laser is a function of the composition and thickness of the active quantum well (QW) layer.

Taking advantage of this aspect of the invention, a monolithic device structure can be constructed which provides dual polarized beams. Moreover, the construction can provide that the separate laser diodes have similar threshold currents. Thus, they can be activated by the same controller yet be separately modulatable.

While a GaInP/AlGaInP QW structure is used as an example, this concept could also be applied to other material systems where tensile-strained QWs are possible, for example GaAsP/AlGaAs, and InGaAs/InGaAsP/InP.

The device of the invention offers a number of advantages. An important benefit is the construction of closely spaced multiple beam diode sources in a common substrate for various applications needing adjacent beams with orthogonal polarizations, for example, for a printer with a monolithic, two beam diode laser. Important also is that the differently polarized beams are generated from semiconductor active body portions that are otherwise physically similar.

These and further objects and advantages of the invention will be best understood in connection with the detailed description that follows of several embodiments of the invention, taken in conjunction with the accompanying drawings.

SUMMARY OF DRAWINGS

FIGS. 1A–C is a schematic view of the energy band structure of a QW laser to explain principles underlying the invention;

DETAILED DESCRIPTION OF PREFERRED EMBODIMENTS

Figure 2:
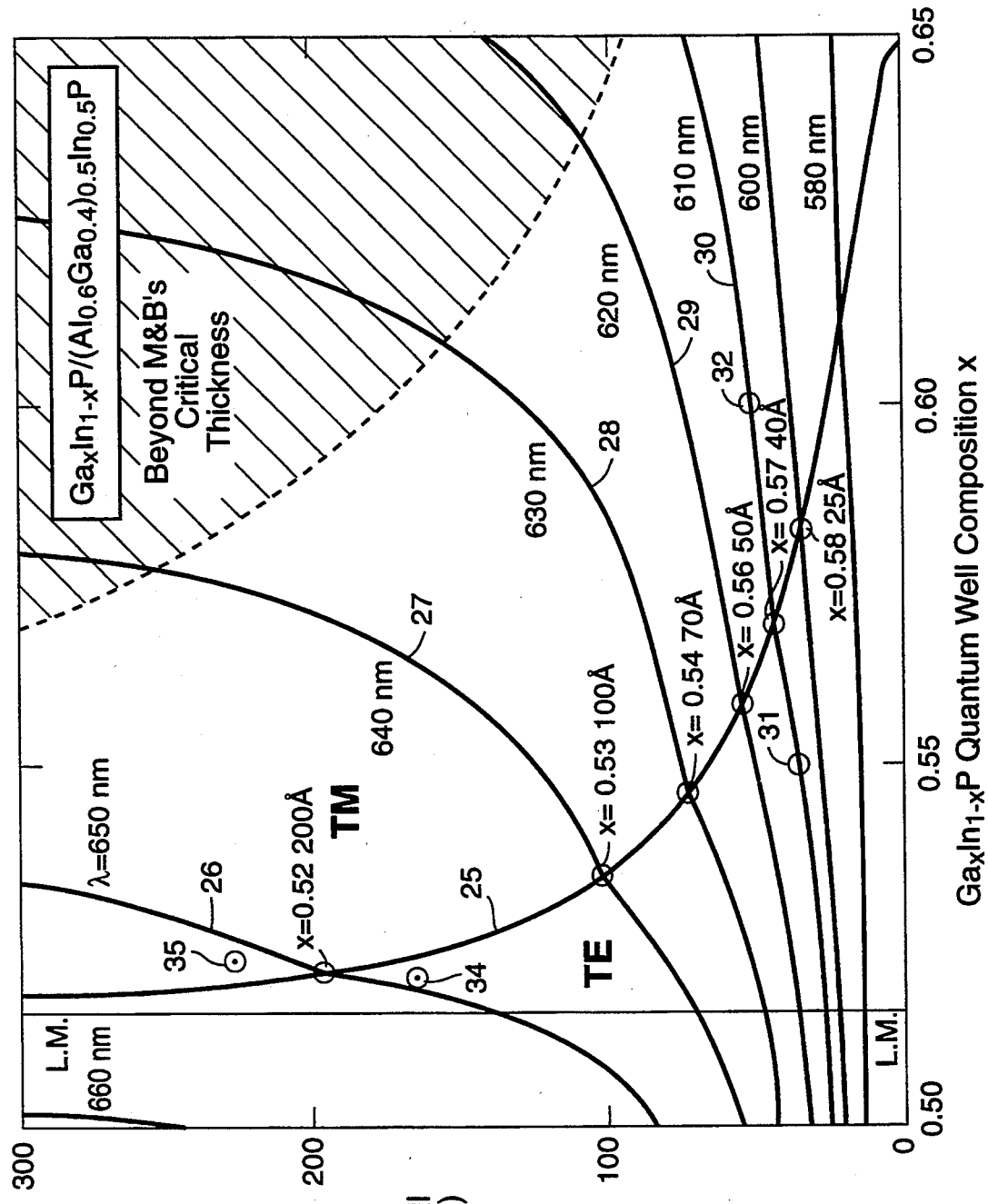
FIG. 2 is a graph plotting QW thickness v. QW composition illustrating TE/TM mode transitions.

For background material, reference is made to the attached Appendix, which lists a number of publications in this field. In addition, reference from time to time will be made to those published papers by a bracketed number for disclosure relevant to this application but which need not be repeated here, the contents of which are hereby incorporated by such references.

As indicated above, quantum well (QW) lasers normally oscillate in the TE polarization, because the n=1 heavy hole transition is the fundamental (lowest energy) transition, as shown in FIG. 1. In FIG. 1, the upper set of lines 10 represent the lower bound of the conduction band, the lower set of lines 11 represents the upper bound of the valence band, and the forbidden bandgap is designated 12.

The notation used is:

HH=Heavy hole energy level. A numerical subscript of 1 means that n=1, or the fundamental, lowest energy transition.

LH=Light hole energy level, with the same meaning given to numerical subscripts.

$\epsilon_1$=Electron level 1 in the conduction band.

The transitions are indicated by arrows. As shown in FIG. 1a, the transition 15 from the electron level $\epsilon_1$ to $HH_1$ 18 is lower in energy than the corresponding transition 16 to $LH_1$ 19.

This is true for both unstrained GaAs/AlGaAs, and GaInP/AlGaInP, and compressively strained InGaAs/AlGaAs, GaInP/AlGaInP, and InGaAs/InGaAsP/InP QW lasers. In unstrained bulk material the HH and LH levels are degenerate at the bandedge. However the quantum size effect in quantum wells shifts the LH farther from the bandedge as shown in FIG. 1a because the quantum shifts indicated by arrows 13 are inversely proportional to the effective mass. Thus the energy of the transition from $\epsilon_1$ to $HH_1$ is lowest. In compressively strained bulk InGaAs/AlGaAs and InGaAs/InGaAsP the HH and LH levels are nondegenerate and the quantum size effect leads to an even greater split between these levels, as shown in FIG. 1b.

In a structure where the light hole and heavy hole band edges are reversed, however, such as can occur in a tensile-strained active region, lasing occurs in the TM polarization. This has been observed in tensile strained InGaAsP/InP QWs and in both bulk and QW devices in the GaInP/AlGaInP/GaAs material systems [2-5].

In accordance with this aspect of the invention, in a device incorporating separate QWs for TE-and TM-mode gain, the polarization of the emission will be a sensitive function of the threshold carrier density (which determines the degree to which the individual band populations are inverted), and other factors such as temperature, facet reflectivity, intracavity loss, cavity length, etc. Such a device structure would allow either polarization to be selected, or switched which is described and claimed in the second referenced related case. This is accomplished with a tensile-strained QW or multiple QWs for TM-mode gain, and compressively-strained or unstrained QWs for TE-mode gain. Alternatively, it can be accomplished with the same QW whose LH and HH band edges line up substantially exactly. This condition is sometimes referred to as near-degeneracy at the band edge, at k=0. This normally means that the band edges are within a small fraction of one kT in energy of one another. Adjustment of the other factors will then determine whether the emitted beam is TE or TM polarized.

Shown in FIG. 1c is the band alignment for this alternative which will allow both polarizations. In the valence band, tensile strain shifts the LH band edge 21 above that of the HH 22. Since the light holes undergo a greater quantum shift than the heavy holes, however, the light hole state is the lowest energy state only for bulk material or for thick wells. At the other extreme, for very thin wells, the heavy hole state can have lowest energy, because it is not quantum shifted to as high an energy as the light hole. Thus, there exists some intermediate thickness where the light hole and heavy hole band edges can line up exactly.

Using parameters from Ref. [6] in a simple square-well potential model which includes the effect of strain [7], this crossover thickness is shown by the curve 25 in FIG. 2, as a function of $Ga_xIn_{1-x}P$ QW composition, clad by lattice-matched $(Al_{0.6}Ga_{0.4})_{0.5}In_{0.5}P$; the lattice matched (to GaAs) alloy has X=0.516. While the exact crossover thickness is a sensitive function of the effective masses and band offsets, which may not be well documented, it is clear that there is an inverse relationship between the strain (which increases the LH-HH split) and the crossover thickness (which must be made thin to compensate).

For a diode laser with a QW of this appropriate thickness derived from FIG. 2, the resulting polarization could be either TE or TM, depending upon the gain anisotropy, and band-filling at threshold. For thicknesses greater than the crossover thickness (to the right of curve 25), TM polarization is observed [2,3,5], while for thicknesses less than the crossover thickness (to the left of curve 25), TE polarization results. Typical QW thicknesses range between 20-300 Å.

The present invention takes advantage of the relationship depicted in FIG. 2 to construct a monolithic QW laser with orthogonally-polarized beams by controlling the thickness and the composition of the active QW layer.

Preferably, one of the constant contour lines referenced 26-30 is chosen, so that the emitting wavelengths are substantially the same, and one active layer is built according to parameters on the right side of the crossover curve 25, and the other active layer is built according to parameters on the left side of the crossover curve 25.

Thus, if, for example, constant contour line 30 is chosen, which is nearly horizontal, then both active layers can have the same thickness (40 Å) but different compositions to achieve different polarizations. The points referenced 31, 32 are examples. The TE mode active layer composition would be $Ga_{0.55}In_{0.45}P$, whereas the TM mode active layer composition would be $Ga_{0.6}In_{0.4}P$.

Alternatively, if a nearly vertical constant contour line 26 were chosen, then the emitting wavelength would be substantially 650 nm, and the same composition could be used for both active layers, the different modes being achieved by different QW layer thickness.

See the points referenced 34, 35. The TE mode active layer would have a thickness of about 170 Å, and the TM mode active layer a thickness of about 220 Å, both with the same $Ga_{0.52}In_{0.48}P$ composition.

The present invention is not limited to achieving TE and TM mode QW lasers in the same monolithic structure by varying the thickness and/or composition of the active QW layer. As FIG. 1c indicates, if both active layers are in near degeneracy at the band edge, then whether the laser will oscillate in the TE or TM mode will depend upon other factors, such as, the diode geometry, its threshold current, its reflectivity, temperature, length, etc. Hence, in accordance with this aspect of the invention, the active layers are given the same composition and thickness, preferably lying on the crossover line 25.

Using this critical structure, there are several ways of achieving side-by-side devices of both polarizations in the same monolithic substrate, shown in FIG. 3. First, with a long-cavity structure, where the (distributed) mirror loss becomes unimportant, the threshold current density is lowest and very little bandfilling occurs. In this case, the lowest threshold transition should oscillate. As the threshold current density is increased by including loss, however, the valence bands begin to fill, so that a higher gain transition can oscillate. Thus, while the TE-mode (heavy hole) or the TM-mode (light hole) may dominate for low-threshold current densities, the three possibilities shown in FIG. 3 all include some means of introducing loss into the cavity, to select the other polarization, which has a higher threshold carrier density but also higher gain.

Figure 3C:
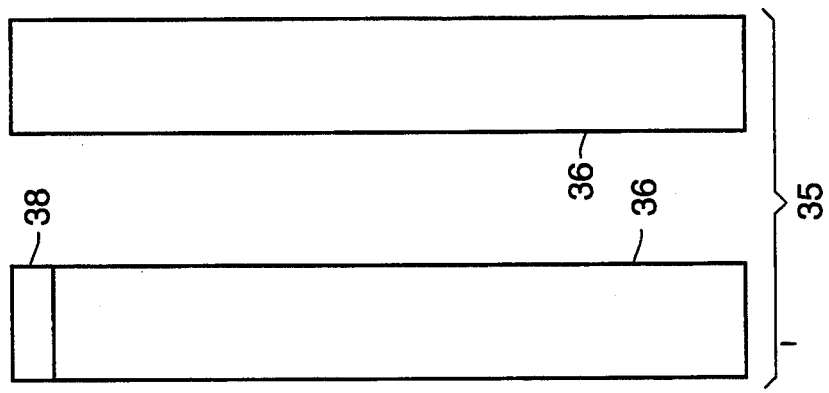
FIGS. 3A–C schematically illustrate various devices in accordance with the invention.
Figure 3B:
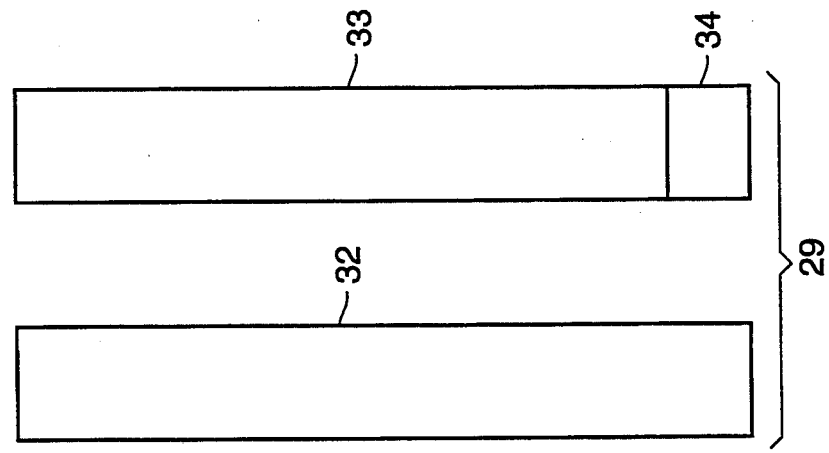
Figure 3A:
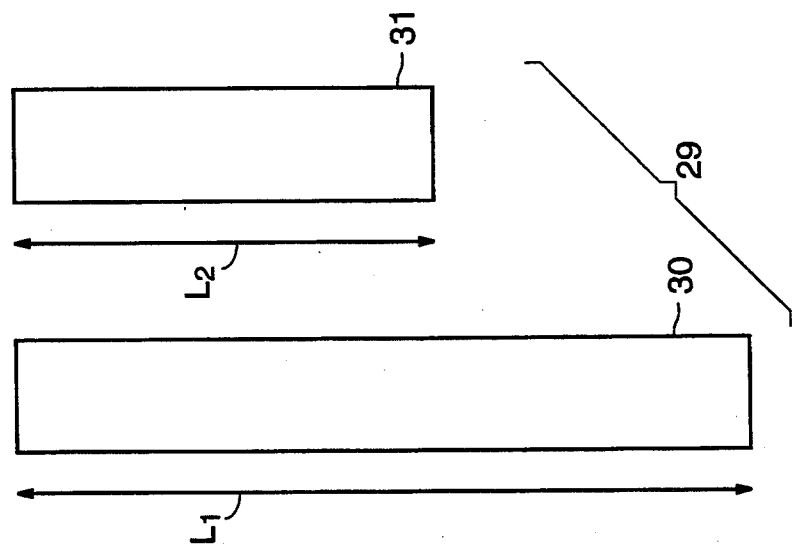

For example, FIG. 3A shows a dual laser device 29 containing long 30 and short-cavity 31 lasers, which could be achieved on the same wafer by (chemically assisted) ion beam-etched facets. The short-cavity device on the right would have a higher threshold current density and oscillate in the higher-gain TM mode. The long cavity device on the left, having a lower threshold current, would oscillate in the lowest threshold TE mode. Alternatively, FIG. 3B shows a dual laser device 29' with an unpumped section 34 on the right laser 33 that can serve as an intracavity absorber, raising the threshold carrier density. If the device 33 on the right is separately contacted in section 34, this section 34 could be forward biased slightly below transparency, so that the losses remain low, lowering the threshold carrier density. Finally, FIG. 3C shows a dual laser device 35 with two pumped sections 36, one of which is pumped to its end while the other contains an unpumped end section 38. The end section 38 is lossy, producing a higher threshold current density in the left laser. These three examples demonstrate ways in which loss can be selectively introduced, to select the desired polarization from a single wafer with separate QWs for TE- and TM-mode gain.

Figure 4A:
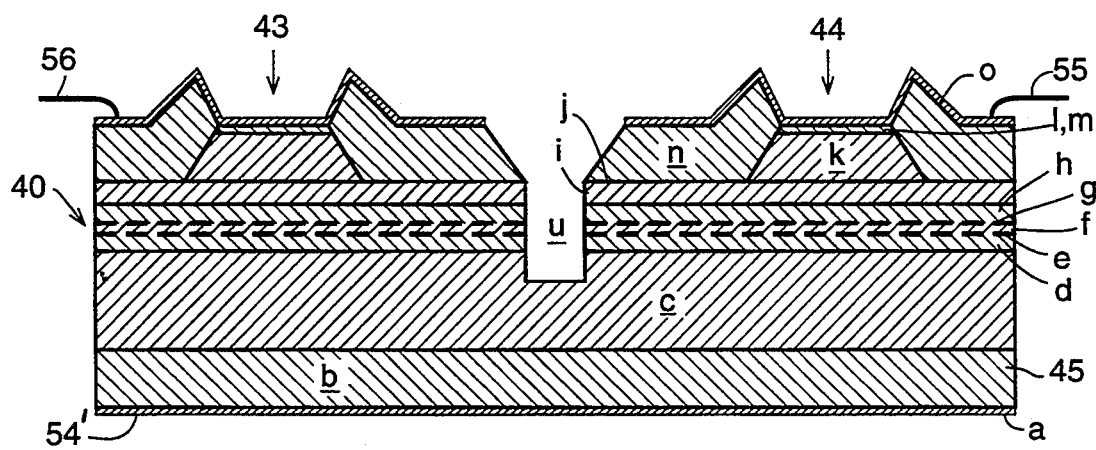
FIGS. 4A and 4B are, respectively, cross-sectional and top views of one form of multiply-emitting QW laser in accordance with the invention.
Figure 4B:
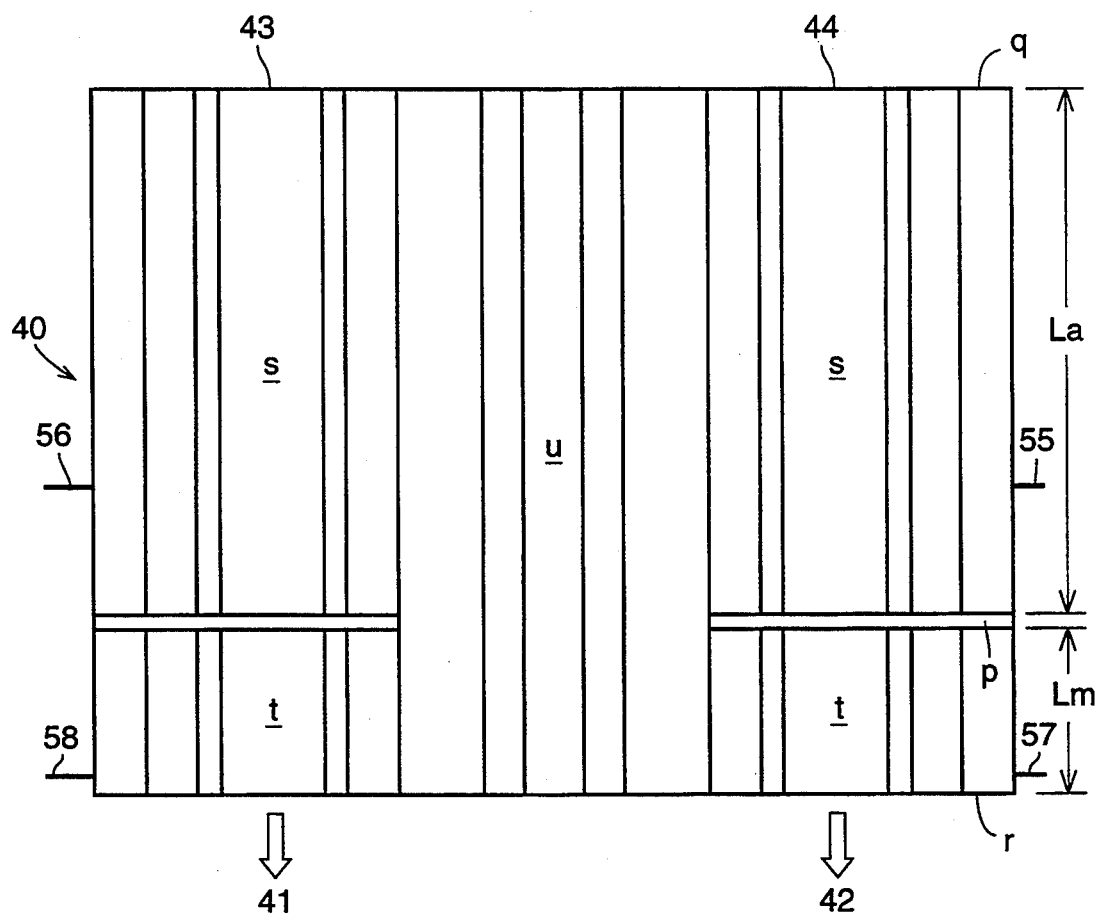

FIG. 4A shows one form of device, in cross-section, embodying the invention. FIG. 4B is a top view corresponding to the FIG. 3 schematic showings. The device comprises a laser structure 40 capable of emitting two laser beams 41, 42 closely spaced to one another and different polarizations from adjacently constructed laser diodes 43,44 on the same substrate 45. In a practical use as a multi-beam light source, the different polarizations would be employed to minimize optical interference or as a light source in multiple station/multiple position printer as disclosed in concurrently filed application D/91293. The structure illustrated is described below with lower-case reference letters:

a: N-ohmic contact metal
b: b: N-type GaAs substrate
c: $(Al_xGa_{1-x})_{0.5}In_{0.5}P$ ($0.6 < x_{clad} < 1.0$) N-cladding layer (0.6–1.5 μm)
d: $(Al_xGa_{1-x})_{0.5}In_{0.5}P$ ($0.2 < x_{SCH} < 0.6$) lower confining layer (500–2000 Å)
e: $Ga_zIn_{1-z}P$ quantum well(s) for TE-mode gain
f: $(Al_xGa_{1-x})_{0.5}In_{0.5}P$ ($0.2 < x_{BARRIER} < 0.6$) barrier between quantum well(s) (20–200 Å)
g: $Ga_zIn_{1-z}P$ quantum well(s) for TM-mode gain
h: $(Al_xGa_{1-x})_{0.5}In_{0.5}P$ ($0.2 < x_{SCH} < 0.6$) upper confining layer (500–2000 Å)
i: $(Al_xGa_{1-x})_{0.5}In_{0.5}P$ ($0.6 < x_{clad} < 1.0$) P-cladding layer (0.1–0.3 μm)
j: $Ga_zIn_{1-z}P$ ($0.5 < z_{ES} < 0.7$) etch stop layer (20–100 Å)
k: $(Al_xGa_{1-x})_{0.5}In_{0.5}P$ ($0.6 < x_{clad} < 1.0$) or $Al_yGa_{1-y}As$ ($y > 0.8$) P-cladding layer (0.6–1.5 μm)
l: $(Al_xGa_{1-x})_{0.5}In_{0.5}P$ barrier reduction layer, graded or stepped from $x = x_{clad}$ to $x = 0$ (500–2000 Å)
m: GaAs P+ cap layer (500–5000 Å)
n: N-type GaAs burying layer; selectively regrown (0.2–2.0 μm)
o: P-ohmic contact metal
p: isolation groove between active and modulator sections
q: back-facet reflective coating
r: front-facet passivation coating
s: active section contact pad
t: modulator section contact pad
u: isolation groove to optically and electrically separate adjacent lasers As a first approximation, the composition and thickness of the $Ga_zIn_{1-z}P$ Qws e and g are determined by the wavelength desired, from the curve in FIG. 2 (following a contour of constant wavelength). Examples are given below:

TABLE

| Desired wavelength | TE-mode-QW | | TM-mode QW | |
|---|---|---|---|---|
| | $z_{TE}$ | $L_{Z,TE}$ | $z_{TM}$ | $L_{Z,TM}$ |
| 650 nm | 0.51 | 100Å | 0.53 | 250Å |
| 640 | 0.52 | 80 | 0.57 | 150 |
| 630 | 0.54 | 60 | 0.58 | 80 |
| 620 | 0.54 | 40 | 0.60 | 60 |

The structure is adjusted so that one polarization has a lower threshold current, while the other polarization has a higher peak gain (at some elevated current density.)

Figure 5:
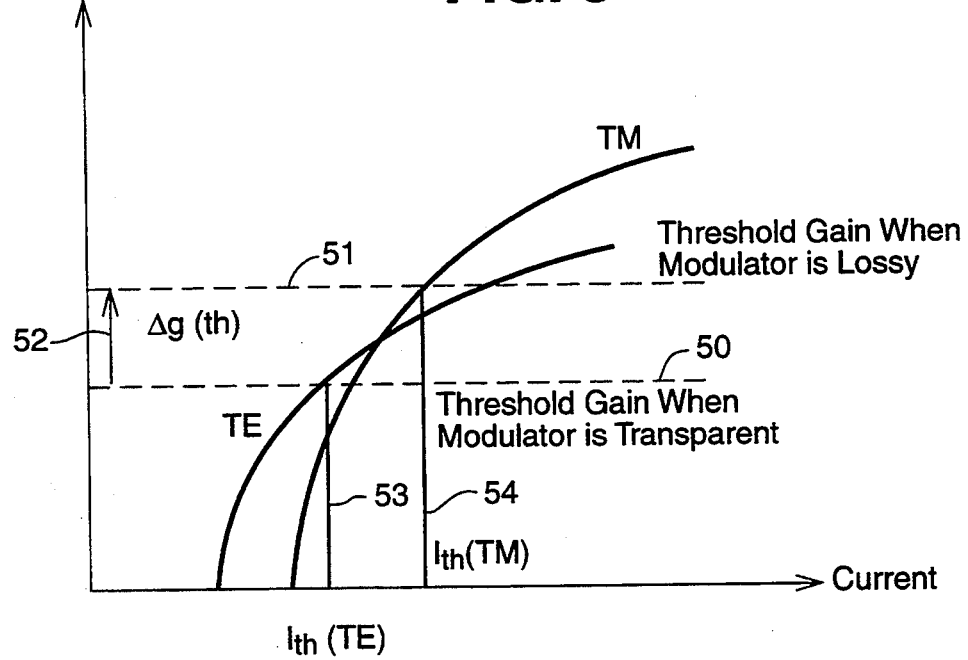
FIG. 5 is a graph illustrating how to control the desired polarization mode.

The graph of FIG. 5 illustrates an example of the desired TE- and TM-mode gain-current relationship. Modal gain is plotted as a function of device current, for both the TM and TE modes. The lower dashed line 50 represents, for example, the threshold gain of the device 43 with modulator section t when it is operated to behave optically transparent. The upper dashed line 51 illustrates the case when the modulator section t is operated so it introduces optical loss. The arrow 52 indicates the threshold gain difference Δg. The vertical line 53 indicates the lower threshold current that will cause the left laser 43 to emit in the higher gain TE mode by activating layer e, and the vertical line 54 indicates the higher threshold current that will cause the right laser 44 to emit in the higher gain TM mode by activating layer g. The curves representing the gain v. current characteristics labelled, respectively, TE and TM show that their respective characteristics cross between the threshold currents represented by vertical lines 53 and 54. So, for this example, which is not intended to be limiting, the TE mode has a lower transparency current, while the TM mode has the greater gain. This, as one embodiment of the invention, is taken advantage of to control the polarization mode. This can be implemented as follows:

When the modulator section t is left unbiased, or when biased below the transparency current density, it is optically absorptive introducing loss. This condition raises the threshold gain, as shown at 51 in FIG. 5. The threshold gain ($g_{th}$) is:

$$g_{th} = \alpha_a + \frac{1}{L_a} \ln \frac{1}{\sqrt{R_f R_r}} + \frac{L_m}{L_a} \alpha_m$$

where $\alpha_a$ = distributed loss in active laser cavity
$R_{f(r)}$ = front (rear) facet reflectivities
$L_{m(a)}$ = length of modulator (active laser) cavities
$\alpha_m$ = modal absorption loss in modulator section However, when the modulator section t is sufficiently forward biased to transparency ($\alpha_m = 0$), the threshold gain is simply that for a laser without any modulator section shown at 50 in FIG. 5 (i.e., the last term disappears in the equation above). When biased even further to provide optical gain ($\alpha_m < 0$), the threshold gain is further reduced. When the modulator is unbiased, reverse biased, or sub-transparency forward biased, it is lossy ($\Delta_m > 0$) and the threshold gain is increased. Thus, the modulator section t can be used to change the intracavity loss, and with the appropriate crossing gain-current-polarization characteristics it will also change the polarization.

The overall cavity's length, indicated by $L_a$ in FIG. 4B, is chosen so that in one active layer the lower threshold mode (the TE-mode in FIG. 5) will oscillate when the modulator section is biased to transparency (if the cavity length $L_a$ is too short, only the higher-gain mode will oscillate). The length $L_m$ and bias of the modulator section t are chosen such that when its current is reduced below transparency, the threshold gain increases enough that the other active layer will oscillate with TM polarization (with higher peak gain).

While the preferred FIG. 4 embodiment shows two QWs, e and g, in each laser, it will be understood that the device of FIG. 4A can incorporate in each laser a single QW as previously described or more than two Qws.

It will be understood that FIG. 5 is only one example of the TE-TM-mode gain-current relationship. Other structures or compositions may exhibit variations of the FIG. 5 curves, though the underlying principles will be the same.

Figure 6:
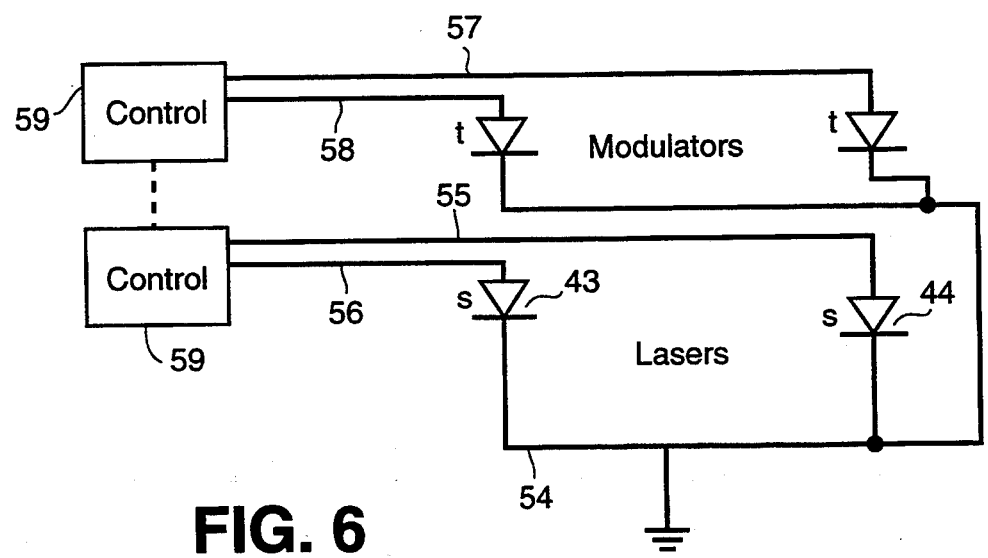
FIG. 6 is one form of a circuit schematic for operating the device of FIG. 4.

FIG. 6 illustrates circuitry for electronically controlling the polarization of the two diodes. The diodes are referenced s, the modulator sections are referenced t, as in FIG. 4. The lead connections to the substrate contact a, top contacts o and modulator sections t are designated 54', 55, 56, 57, and 58, respectively, in FIG. 4. Controllers 59 control the operation by determining when each diode 43, 44 will fire, simultaneously or alternatively, and the electronic signals to the modulator sections from the controllers 59 determine their biased states and therefore whether they behave optically transparent or optically absorbent.

Figure 7:
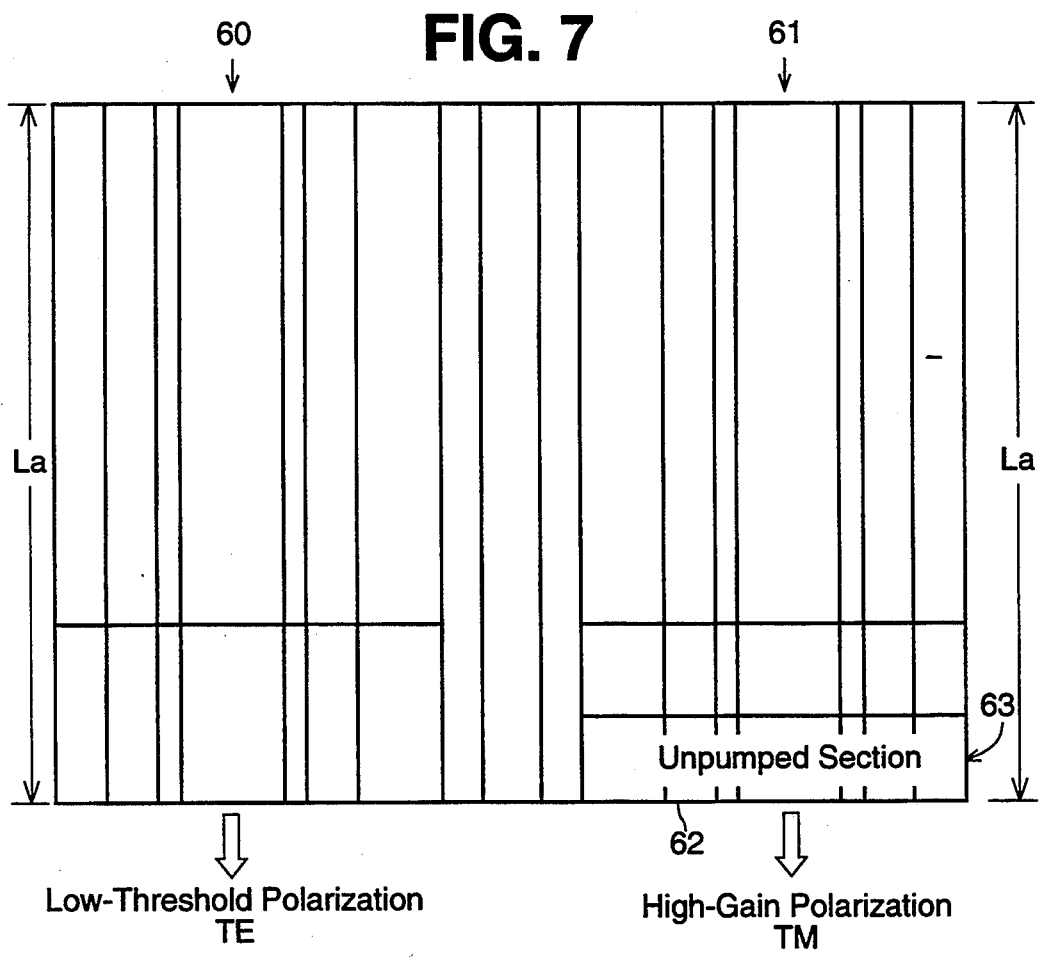
FIG. 7 shows another laser construction in accordance with the invention with fixed polarization modes.

FIG. 7 illustrates another embodiment of the invention, in a view from the top, with adjacent diodes 60,61, both of the same length of cavity $L_a$, but the diode 61 on the right with a contact-free area 62 serving as an unpumped section 63. Each laser operates in a fixed polarization, and the unpumped section 63 of the device 61 can serve to provide a loss which drives the device into the high-gain TM polarization mode. In this case, the cavity length, $L_a$ is chosen so that the low threshold TE mode normally oscillates, as in the device 60 on the left. The adjacent (right-hand side) laser 61 contains the unpumped section along the cavity, which increases the threshold gain requirement to a level above where the TE- and TM-mode gain-current curves crossover (FIG. 5). Thus, only the polarization with the higher-modal gain will oscillate for this case of a lossy cavity. Because of bandfilling, the lasers when operated in the TE or TM modes may not have exactly the same wavelength.

Figure 8:
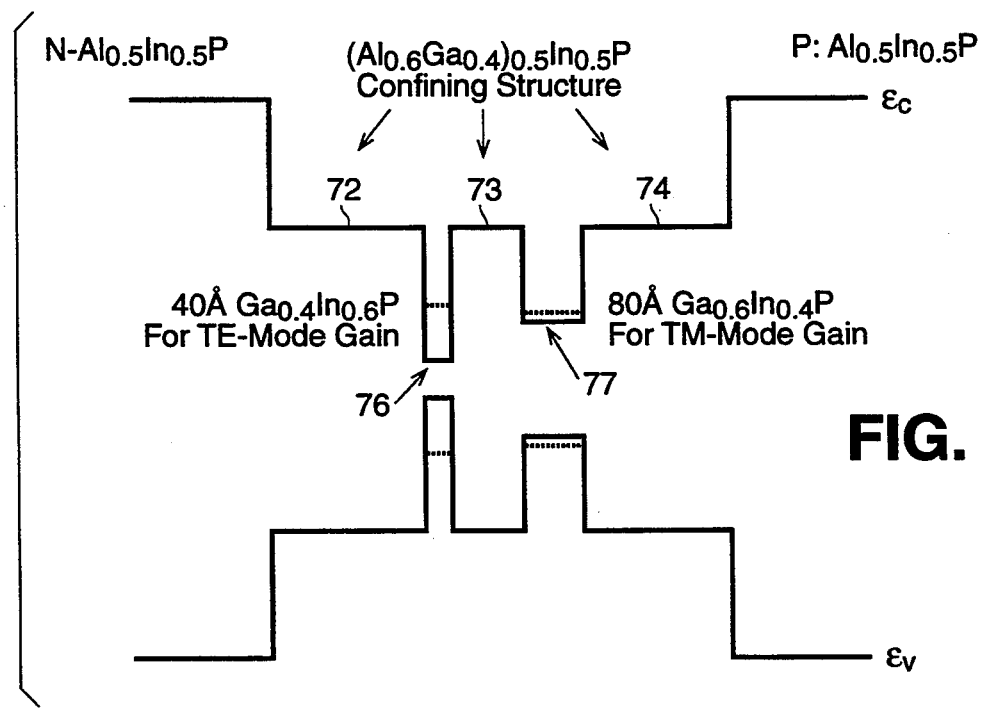
FIG. 8 shows another laser construction in accordance with the invention for selectively controlling the polarization mode.
Figure 9:
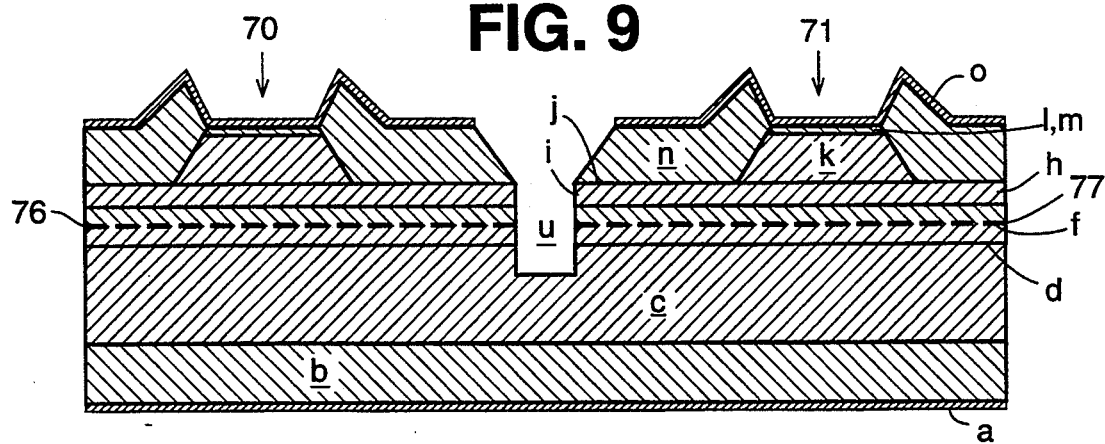
FIG. 9 is a schematic view of a laser construction in accordance with the invention based upon the band diagrams of FIG. 8.

FIG. 8 illustrates achieving dual mode polarization with active layers of different composition and thickness. The side-by-side QW lasers are indicated at 70, 71 in FIG. 9. The compositions of the confining structure 72..74 are stated in the figure. In this instance, both the active layers in the left diode 70 and in the right diode 71 contain both a 40 Å thick QW 76 whose composition is $Ga_{0.4}In_{0.6}P$, for TE-mode gain, and an 80 Å thick QW 77 whose composition is $Ga_{0.6}In_{0.4}P$ for TM-mode gain. The left diode 70 would be made to oscillate in the TE mode whereas the right diode would be made to oscillate in the TM mode, all other factors being the same for both diodes. The table lists in the second-fifth columns other examples of composition and thickness to obtain TE or TM polarization at a particular wavelength. In these examples, each active layer would contain at least two QWs. The different modes are obtained as described in connection with FIG. 3 with, for example, different cavity lengths or a loss modulator. If the thickness and composition of the Qws were the same, falling on the curve 25 of FIG. 2, then the different modes can be obtained as described in connection with FIGS. 7 and 10, for example, by varying the threshold current, intracavity losses, temperature, or reflectivity. As still a further alternative, a QW for the left laser can be compressively-strained to operate in the TE mode, and a QW for the right laser can be tensile-strained to operate in the TM mode, so that when both lasers are activated, adjacent, orthogonally-polarized beams are produced.

Figure 10:
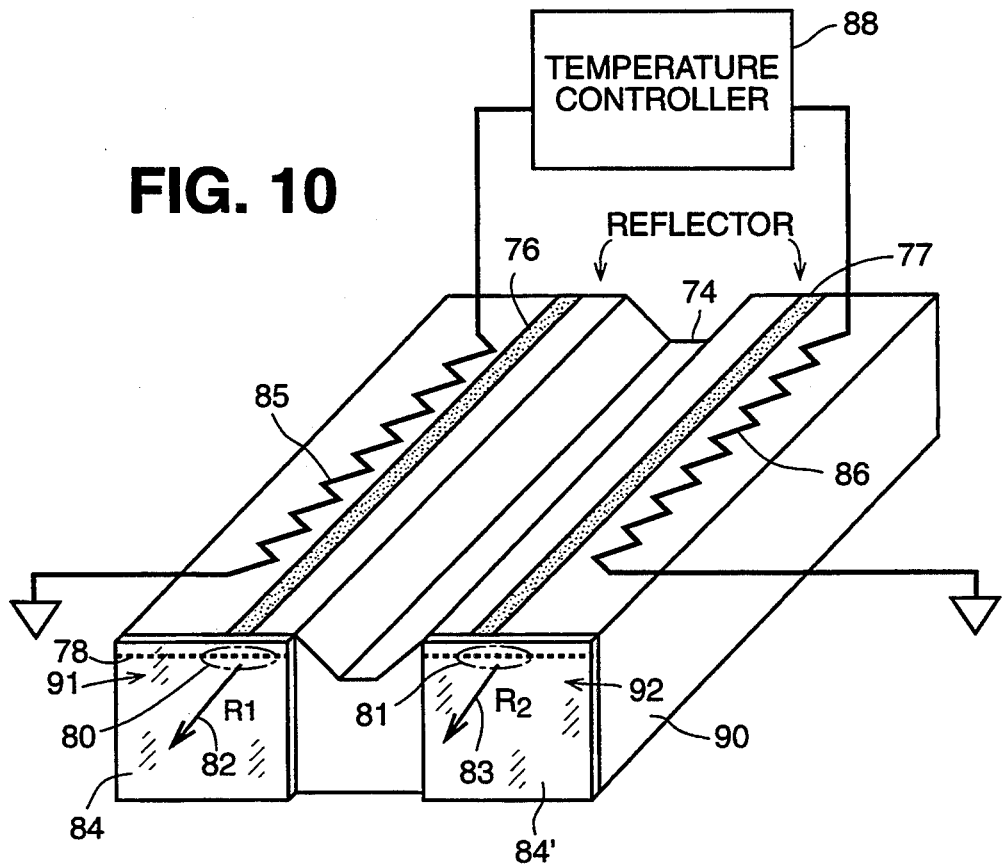
FIG. 10 shows still another laser construction in accordance with the invention.

As earlier mentioned, there may be applications in which it would be desirable not only that orthogonally-polarized beams are generated from the same monolithic structure, but also that the emitting diodes have similar threshold currents, so that they can be activated from the same electrical source. This can be achieved by a judicious choice of compositions and geometries, using the graph of FIG. 5. FIG. 5 illustrates that TE and TM mode operation can be achieved with the same threshold current by varying biasing currents and/or as indicated in FIG. 10 by varying temperature or facet reflectivity. Some experimentation may be necessary to achieve the right combination of parameters.

It will be clearly understood that the invention is not limited to the examples given, which illustrate various ways to construct QW laser diodes whose polarization mode is controllable electronically or physically, so that multiple such diodes can be mounted side-by-side to generate TE and TM mode emissions. Nor, as will be evident is the invention limited to the specific geometry or compositions of the examples given. The references cited in the Appendix provide many more examples of compositions and geometries suitable for use in the invention as will be evident to those skilled in this art. For example, the thickness and composition of the QWs are most important in determining the gain-current characteristic in each polarization. Other structure parameters, however, can also be adjusted to give the desired gain-current-polarization characteristics. For instance, the peak gain in a particular polarization can be increased by using multiples of the appropriate QW, instead of just a single QW for each polarization, as shown above. Similarly, the modal gain available from one QW can be increased over that available from the other by its placement within the separate confinement heterostructure as described in copending application Ser. No. 07/779,207, filed Oct. 18, 1991. In this case, a QW centered in the guide leads to greater modal gain compared to the modal gain from a QW which is off-axis. Since the TE-mode QW is thinnest, its transparency current can be made lower by making it as thin as possible. This also reduces its modal gain, leading to the characteristic shown above in FIG. 5.

While a preferred embodiment of the invention embodies a semiconductor material with separate QWs in one or plural diodes, with one or the other QW activated to generate a radiation beam with the desired TE or TM mode gain, it will be understood as explained above that one or both diodes can have a semiconductor material with a single QW whose composition and thickness causes it to fall on the curve 25 of FIG. 2. The desired TE or TM mode is then activated by threshold current selection as per FIG. 5, or by the biasing schemes described here and in the related case, Ser. No. 07/948,522.

FIG. 10 shows an embodiment of the invention which in a common substrate are built two side-by-side diode laser structures, electrically isolated from each other. Stripe contacts 76, 77 are shown on top. The contact at the bottom is not shown. The active laser region is indicated by the dotted line 78, and thus the left laser 91 will emit from the region 80 in the forward direction indicated by arrow 82, whereas the right laser 92 will emit from the region 81 in the direction 83, through slightly transparent front reflectors 84, 84'. The back reflectors are fully reflective. Deposited heater elements 85, 86 are provided on each laser, and their current is controlled by a temperature controller 88.

Providing temporary surges or pulses of current selectively to the heaters 85, 86 should enable the temperature of the underlying laser to be selectively controlled during operation. A higher temperature alters the TE and TM modal gain-current relation, and requires a higher threshold current which could produce the TM mode.

FIG. 10 also illustrates that the reflectivity of the front reflectors 84, 84' can also be controlled to produce the different polarization modes. If the reflectivity $R_1$ at the front facet is high, the laser 91 has a low threshold and will operate in the TE mode. If the reflectivity $R_2$ is lower than $R_1$, then the laser 92 has a higher threshold and higher gain mode and will operate in the TM mode. The way to control facet reflectivity is described in detail in reference [9].

Material preparation, and diode fabrication are described in detail in references [10] and [11]. For completeness' sake, as an example, a preferred way of making the FIG. 4 embodiment is given below:

The multiple laser structure shown in FIG. 4 can be fabricated as follows. Layers c through m are epitaxially grown uniformly across substrate b by a technique such as metalorganic chemical vapor deposition (MOCVD) as is well known in the art. Pairs of mesas are then formed by masking pairs of stripes with a material such as $Si_3N_4$ before etching through layers k, l, and m down to etch stop layer j. These mesas are typically spaced by 10 to 25 $\mu m$ but can be farther apart if desired. With the mask remaining on the top of the mesas, the etched wafer is again inserted in the MOCVD reactor and layer n is selectively regrown everywhere except on the top of the mesas, as is well known in the art. After regrowth of layer n the striped masks on top of the mesas are removed and a liftoff mask consisting of a stripe placed between each pair of overgrown mesas 43, 44 is deposited. After metallic layer o is deposited over the entire wafer, the liftoff stripes are etched away leaving individually addressable contacts separated by an open, unmetallized area between each pair of overgrown mesas. This unmetalized area can be from 2 to 10 $\mu m$ wide.

After the independently addressable contacts are defined for lasers 43 and 44, an isolation groove u is added to the structure in order to optically, electrically and thermally isolate the closely spaced lasers. Without the groove, the two stripe contacts would be electrically connected via the regrown GaAs, causing severe electrical crosstalk. Furthermore, diffusion of carriers in the active region contributes to electrical crosstalk between stripes, while optical crosstalk arises from light leaking laterally between adjacent devices. The isolation groove u effectively eliminates these crosstalk mechanisms, so long as it extends through the laser active region. To thermally isolate the closely spaced lasers, the isolation groove must extend into the substrate.

While U.S. Pat. No. 4,069,463 describes an isolation system, the way in which the groove u is made, as described below, is novel and a feature of the invention of the present case. Moreover, the isolation technique of the present invention is for a semiconductor structure have adjacent laser structures generating differently polarized radiation beams, in one embodiment of which the structures are sensitive to ambient temperature.

The isolation groove is formed by etching the semiconductor layers in the unmetalized area between the mesas. Groove u is formed by using a two step etching process. First a GaAs enchant such as $5H_2SO_4:1H_2O_2:1H_2O$ at 30° C. is used to etch a 2 to 10 $\mu m$ wide stripe through layer n. This step is followed by a second etch using a non-GaAs etchant such as concentrated HCl, HBr, or hot (70°–90° C.) $H_2SO_4$ to etch through layers j through c. In this case, the GaAs is not etched, and so serves as an etch mask for making the trench. For most complete isolation, the groove can be etched into the substrate b and may therefore be 3 to 4 $\mu m$ deep. It is understood that this is a preferred way of making the FIG. 4 structure, the invention is not limited to this way, and other processes can also be used as will be evident to those skilled in this art.

While the invention has been described and illustrated in connection with preferred embodiments, many variations and modifications as will be evident to those skilled in this art may be made therein without departing from the spirit of the invention, and the invention as set forth in the appended claims is thus not to be limited to the precise details of construction set forth above as such variations and modifications are intended to be included within the scope of the appended claims.

APPENDIX

References

[1.] S. R. Chinn, P. S. Zory, and A. R. Reisinger, IEEE Jour Quantum Electronics 24, 2191–2214 (1988).

[2.] P. J. A. Thijs, L. F. Theimeijer, P. I. Kuindersma, J. J. M. Binsma, and T. van Dongen, IEEE Jour, Quantum Electronics 27, 1426–1439 (1991).

[3.] L. F. Teimeijer, P. J. A. Thijs, P. J. de Waard, J. J. M. Binsma, and T. van Dongen, Appl. Phys. Lett. 58, 2738–2740 (1991).

[4.] M. J. B. Boermans, S. H. Hagen, A. Valster, Mn. N. Finke, and J. M. M. van der Heyden, Electronics Lett. 26, 1438–1439 (1990).

[5.] D. F. Welch, T. Wang, and D. R. Scifres, Electronics Lett. 27, 693–695 (1991).

[6.] M. Kondo, K. Domen, C. Anayama, T. Tanahashi, and K. Nakajima, Jour. Crystal Growth 107, 578–582 (1991).

[7.] S. H. Pan, H. Shen, Z. Hang, F. H. Pollak, W. Zhuang, Q. Xu, A. P. Roth, R. A. Masut, C. Lacelle, and D. Morris, Phys. Rev. B-38, 3375–3382 (1988).

[8.] S. W. Carzine and L. A. Caldren, Appl. Phys. Lett., 59, 558–590 (1991).

[9.] M. C. Casey, Jr. and M. B. Panish, Heterostructure Lasers Part A: Fundamental Principles, Academic Press Orlando, Fla. (1978) pages 79–82.

[10.] "GainAsP Alloy Semiconductors", T. P. Pearsall, ed. John Urley & Sons, NY (1982) pages 61–106.

[11.] M. C. Casey, Jr. & M. B. Panish, "Heterostructure Lasers Part B: Materials & Operating Characteristics", Academic Press, Orlando, Fla. (1978) pages 132–148.

What is claimed is:

1. A multi-beam semiconductor QW laser, comprising:
   (a) a semiconductor body having at least first and second active portions of the same material exhibiting heavy hole and light hole energy band edges and capable of lasing and providing TE-mode polarized gain from heavy hole band transitions and TM-mode polarized gain from light hole band transitions,
   (b) electrodes for introducing carriers into said active body portions,
   (c) optical reflectors associated with the active body portion,
   (d) said active portions lasing in its TE-mode or its TM-mode in response to its threshold carrier density,
   (e) means for driving said first active portion to lase in its TE mode and means for driving said second active portion to lase in its TM mode.

2. The laser of claim 1, wherein said active portions have degenerate LH and HH band edges.

3. A dual polarization multi-beam emitting semiconductor QW laser, comprising:
   (a) a semiconductor body having at least first and second active portions of the same material exhibiting heavy hole and light hole energy band edges and capable of lasing and providing TE-mode polarized gain from heavy hole band transitions and TM-mode polarized gain from light hole band transitions,
   (b) said first and second separate active portions each including at least first and second layers, said first layer being tensile strained for TM-mode operation, said second layer being compressive, tensile, or un-strained for TE-mode operation,
   (c) electrodes for introducing carriers into the active portions,
   (d) optical reflectors associated with the semiconductor body,
   (e) means for activating said first and second active portions to lase respectively in their TM-mode and TE-mode.

4. A dual polarization multi-beam emitting semiconductor QW laser, comprising:
   (a) a semiconductor body having at least first and second active portions of a material exhibiting heavy hole and light hole forbidden band defined by energy band edges and capable of lasing and providing TE-mode polarized gain from heavy hole band transitions and TM-mode polarized gain from light hole band transitions,
   (b) said first and second separate active portions being, respectively, tensile strained for TM-mode operation and compressive, tensile, or un-strained for TE-mode operation,
   (c) electrodes for introducing carriers into the active portions,
   (d) optical reflectors associated with the semiconductor body,
   (e) means for activating said first and second active portions to lase respectively in their TM-mode and TE-mode, said means for activating comprising means for changing the threshold carrier density of said first and second active portions.

5. The laser of claim 4, wherein the means for changing the threshold carrier density comprises means for changing the temperature of the active portions.

6. The laser of claim 4, wherein the means for changing the threshold carrier density comprises means for selectively introducing loss into the active portion.

7. The laser of claim 4, wherein the means for changing the threshold carrier density comprises means for altering the reflectivity of the optical reflectors.

8. A dual-polarization dual-emitting semiconductor QW laser, comprising:
   (a) a semiconductor body having first and second active portions of material exhibiting heavy hole and light hole band edges and capable of lasing and providing TE-mode polarized gain from heavy hole band transitions and TM-mode polarized gain from light hole band transitions,
   (b) electrodes for introducing carriers separately into the active body portions,
   (c) optical reflectors associated with the active body portions,
   (d) means for introducing a controlled loss into the active portions in order to enable the first active body portion to lase in its TE mode and the second active body portion to lase simultaneously in its TM-polarization mode.

9. The laser of claim 8, wherein the means for introducing a controlled loss comprises an intracavity loss modulator.

10. The laser of claim 8, wherein the semiconductor active portion comprises a GaInP/AlGaInP/GaAs QW structure.

11. The laser of claim 8, wherein the semiconductor active portion comprises a GaAsP/AlGaAs QW structure.

12. The laser of claim 8, wherein the semiconductor active portion comprises an InGaAs/InGaAsP/InP QW structure.

13. A dual polarization multi-beam emitting semiconductor QW laser, comprising:
 (a) a semiconductor body having at least first and second side-by-side active portions of a material exhibiting heavy hole and light hole band edges and capable of lasing and providing TE-mode polarized gain from heavy hole band transitions and TM-mode polarized gain from light hole band transitions, said first and second active portions each having both TE-modal and TM-modal gain v. current characteristics and forming adjacent first and second QW laser structures, said TE-modal gain v. current characteristic crossing the TM-modal gain v. current characteristic,
 (b) electrodes for introducing carriers into the active portions,
 (c) optical reflectors associated with each laser structure,
 (d) means connected to the adjacent laser structures for causing the first QW laser structure to lase in its TE-mode and the second QW laser structure to lase in its TM-mode.

14. The laser of claim 13, wherein each laser structure comprises a cavity section and a modulator section, further comprising means for biasing the modulator section to exhibit transparent or absorbent behaviour.

15. The laser of claim 14, wherein one laser is configured to have low-threshold polarization, and the other laser is configured to have high gain polarization.

16. A dual polarization simultaneously emitting, multiple-beam semiconductor QW laser, comprising:
 (a) a common substrate,
 (b) first and second active QW layers contained in an optical waveguide on said substrate,
 (c) means for defining side-by-side multiple laser structures in said optical waveguide capable upon activation of simultaneously emitting side,by, side dual polarized beams,
 (d) said first QW layer or layers having a thickness and composition such that it oscillates in the TE mode in one laser structure in said optical waveguide,
 (e) said second QW layer or layers having a thickness and composition such that it oscillates in the TM mode in another laser structure in said optical waveguide.

17. The laser of claim 16, further comprising means for activating the first QW layer in said one of the multiple laser structures, and means for activating the second QW layer in said another of the multiple laser structures.

18. The laser of claim 17, wherein the semiconductor active portion comprises a GaInP/AlGaInP/GaAs QW structure.

19. The laser of claim 17, wherein the semiconductor active portion comprises an InGaAs/InGaAsP/InP QW structure.

20. The laser of claim 16, further comprising means for passing current through the first and second QW layers.

21. A multi-polarization, multi-beam emitting semiconductor laser array, comprising:
 (a) a common substrate having multiple epitaxially grown layers,
 (b) at least first and second active laser devices built into the epitaxially-grown layers, said first laser device generating at a first location a TE-polarized radiation beam, said second laser device generating at a second location spaced from the first location a TM-polarized radiation beam,
 (c) means for independently addressing the first and second laser devices,
 (d) means for electrically isolating the first and second laser devices.

22. A multi-polarization, multi-beam emitting semiconductor laser, comprising:
 (a) a common substrate having multiple epitaxially grown layers,
 (b) at least first and second active laser devices built into the epitaxially-grown layers, said first laser device generating a TE-polarized radiation beam, said second laser device generating a TM-polarized radiation beam,
 (c) means for independently addressing the first and second laser devices,
 (d) means for electrically isolating the first and second laser devices, said means of element (d) including means for optically isolating the first and second laser devices.

23. The laser of claim 22, where the means of (d) comprise an isolation groove between the laser devices and extending through at least some of the epitaxially-grown layers.

24. The laser of claim 23, wherein the groove extends into the substrate to thermally isolate the laser devices.

25. A dual-polarization dual-emitting semiconductor QW laser, comprising:
 (a) a semiconductor body having first and second active portions of material exhibiting heavy hole and light hole band edges and capable of lasing and providing TE-mode polarized gain from heavy hole band transitions and TM-mode polarized gain from light hole band transitions,
 (b) electrodes for introducing carriers into the active body portion,
 (c) optical reflectors associated with the active body portion,
 (d) means for introducing a controlled loss into the active portions in order to cause the first active body portion to lase in its TE mode and the second active body portion to lase in its TM-polarization mode, said means for introducing a controlled loss comprising, in the semiconductor body, an unpumped section for serving as an intracavity saturable absorber.

26. A dual polarization multi-beam emitting semiconductor QW laser, comprising:
 (a) a semiconductor body having at least first and second side-by-side active portions of a material exhibiting heavy hole and light hole band edges and capable of lasing and providing TE-mode polarized gain from heavy hole band transitions and TM-mode polarized gain from light hole band transitions, said first and second active portions forming adjacent first and second QW laser structures, (b) electrodes for introducing carriers into the active portions, (c) optical reflectors associated with each laser structure, (d) means connected to the adjacent laser structures for causing the first to lase in its TE-mode and the second to lase in its TM-mode, said means for causing of element (d) comprising means for changing the threshold current density of said first and second active portions.

27. A dual-polarization dual-emitting semiconductor QW laser, comprising:

(a) a semiconductor body having first and second active portions of material exhibiting heavy hole and light hole band edges and capable of lasing and providing TE-mode polarized gain from heavy hole band transitions and TM-mode polarized gain from light hole band transitions, (b) electrodes for introducing carriers into the active body portion, (c) optical reflectors associated with the active body portion, (d) means for introducing a controlled loss into the active portions in order to cause the first active body portion to lase in its TE mode and the second active body portion to lase in its TM-polarization mode, (e) said laser comprising QWs whose thicknesses are related to the QW composition to give substantial alignment between the heavy-hole and light-hole band edges.

28. A dual polarization multi-beam emitting semiconductor QW laser, comprising:

(a) a semiconductor body having at least first and second side-by-side active portions of a material exhibiting heavy hole and light hole band edges and capable of lasing and providing TE-mode polarized gain from heavy hole band transitions and TM-mode polarized gain from light hole band transitions, said first and second active portions forming adjacent first and second QW laser structures, (b) electrodes for introducing carriers into the active portions, (c) optical reflectors associated with each laser structure, (d) means connected to the adjacent laser structures for causing the first to lase in its TE-mode and the second to lase in its TM-mode, (e) each laser structure comprising a cavity section and a modulator section and comprising means for biasing the modulator section to exhibit transparent or absorbent behavior, (f) one laser being configured to have low-threshold polarization, and the other laser being configured to have high gain polarization, said other laser having an unpumped section.

29. A dual polarization multi-beam emitting semiconductor QW laser, comprising:

(a) a semiconductor body having at least first and second side-by-side active portions of a material exhibiting heavy hole and light hole band edges and capable of lasing and providing TE-mode polarized gain from heavy hole band transitions and TM-mode polarized gain from light hole band transitions, said first and second active portions forming adjacent first and second QW laser structures, (b) electrodes for introducing carriers into the active portions, (c) optical reflectors associated with each laser structure, (d) means connected to the adjacent laser structures for causing the first to lase in its TE-mode and the second to lase in its TM-mode, (e) said first and second active portions each comprising a single QW whose LH and HH band edges line up substantially exactly.

30. A dual polarization, multiple-beam emitting semiconductor QW laser, comprising:

(a) a common substrate, (b) first and second active QW layers contained in an optical waveguide on said substrate, (c) means for defining multiple laser structures in said optical waveguide, (d) said first QW layer or layers having a thickness and composition such that it oscillates in the TE mode in one laser structure in said optical waveguide, (e) said second QW layer or layers having a thickness and composition such that it oscillates in the TM mode in another laser structure in said optical waveguide, (f) means for activating the first QW layer in the one of the multiple laser structures, (g) means for activating the second QW layer in the another of the multiple laser structures, (h) the QW layers being separated by a distance of about 20-200 Å.

31. A dual polarization, multiple-beam emitting semiconductor QW laser, comprising:

(a) a common substrate, (b) first and second active QW layers contained in an optical waveguide on said substrate, (c) means for defining multiple laser structures in said optical waveguide, (d) said first QW layer or layers having a thickness and composition such that it oscillates in the TM mode in another laser structure in said optical waveguide, (e) said second QW layer or layers having a thickness and composition such that it oscillates in the TM mode in another laser structure in said optical waveguide, (f) means for activating the first QW layer in the one of the multiple laser structures, (g) means for activating the second QW layer in the another of the multiple laser structures, (h) means for separately modulating the optical loss of said QW layers.

32. A dual polarization, multiple-beam emitting semiconductor QW laser, comprising:

(a) a common substrate, (b) first and second active QW layers contained in an optical waveguide on said substrate, (c) means for defining multiple laser structures in said optical waveguide, (d) said first QW layer or layers having a thickness and composition such that it oscillates in the TM mode in another laser structure in said optical waveguide, (e) said second QW layer or layers having a thickness and composition such that it oscillates in the TM mode in another laser structure in said optical waveguide, (f) means for passing current through the first and second QW layers, the QW layers have substantially the same threshold current.

33. A dual polarization, multiple-beam emitting semiconductor QW laser, comprising:
(a) a common substrate,
(b) first and second active QW layers contained in an optical waveguide on said substrate,
(c) means for defining multiple laser structures in said optical waveguide,
(d) said first QW layer or layers having a thickness and composition such that it oscillates in the TM mode in another laser structure in said optical waveguide,
(e) said second QW layer or layers having a thickness and composition such that it oscillates in the TM mode in another laser structure in said optical waveguide,
(f) means for activating the first QW layer in the one of the multiple laser structures,
(g) means for activating the second QW layer in the another of the multiple laser structures,
(h) said semiconductor active portion comprising a GaAsP/AlGaAs QW structure.

* * * * *